(12) United States Patent
Lee

(10) Patent No.: US 6,175,404 B1
(45) Date of Patent: *Jan. 16, 2001

(54) EXPOSURE APPARATUS HAVING DYNAMICALLY ISOLATED REACTION FRAME

(75) Inventor: Martin E. Lee, Saratoga, CA (US)

(73) Assignee: Nikon Corporation, Tokyo (JP)

( * ) Notice: Under 35 U.S.C. 154(b), the term of this patent shall be extended for 0 days.

This patent is subject to a terminal disclaimer.

(21) Appl. No.: 09/320,703

(22) Filed: May 27, 1999

Related U.S. Application Data

(62) Division of application No. 09/192,153, filed on Nov. 12, 1998, which is a continuation of application No. 08/416,558, filed on Apr. 4, 1995, now Pat. No. 5,874,820.

(51) Int. Cl.$^7$ .................................................. G03B 27/62
(52) U.S. Cl. ................................................ 355/53; 355/75
(58) Field of Search .................................. 355/53, 74–76; 250/548; 318/649, 611, 575; 414/266, 282

(56) References Cited

U.S. PATENT DOCUMENTS

| | | |
|---|---|---|
| Re. 27,289 | 2/1972 | Sawyer . |
| Re. 27,436 | 7/1972 | Sawyer . |
| 3,789,285 | 1/1974 | Nishizawa ............................. 318/687 |
| 3,889,164 | 6/1975 | Nishizawa et al. ................... 318/640 |
| 3,935,486 | 1/1976 | Nagashima ............................ 310/12 |
| 4,019,109 | 4/1977 | McCoy et al. ....................... 318/640 |
| 4,087,729 | 5/1978 | Yamazaki et al. ................... 318/601 |
| 4,129,291 | 12/1978 | Kato et al. ............................ 269/73 |
| 4,234,175 | 11/1980 | Sato et al. ............................. 269/73 |
| 4,392,642 | 7/1983 | Chitayat ................................ 269/73 |
| 4,409,860 | 10/1983 | Moriyama et al. ..................... 74/479 |
| 4,425,508 | 1/1984 | Lewis, Jr. et al. ................. 250/442.1 |
| 4,443,743 | 4/1984 | Forys et al. .......................... 318/115 |
| 4,485,339 | 11/1984 | Trost .................................... 318/640 |
| 4,492,356 | 1/1985 | Taniguchi et al. .............. 248/346.06 |
| 4,504,144 | 3/1985 | Trost ..................................... 356/150 |
| 4,506,204 | 3/1985 | Galburt ................................ 318/653 |
| 4,506,205 | 3/1985 | Trost et al. .......................... 318/653 |
| 4,507,597 | 3/1985 | Trost .................................... 318/653 |
| 4,514,858 | 4/1985 | Novak ................................... 378/34 |
| 4,516,253 | 5/1985 | Novak ................................... 378/34 |
| 4,525,659 | 6/1985 | Imahashi et al. .................... 318/649 |
| 4,561,773 | 12/1985 | Sato ....................................... 355/43 |
| 4,575,942 | 3/1986 | Moriyama ............................ 33/1 M |
| 4,615,515 | 10/1986 | Suzuta et al. ......................... 269/73 |
| 4,628,238 | 12/1986 | Smulders et al. ................... 318/653 |
| 4,630,942 | 12/1986 | Tsumaki et al. ......................... 384/8 |
| 4,641,071 | 2/1987 | Tazawa et al. ...................... 318/640 |
| 4,648,723 | 3/1987 | Sugiyama et al. ...................... 384/9 |
| 4,648,724 | 3/1987 | Sugiyama et al. ...................... 384/9 |
| 4,653,408 | 3/1987 | Nagashima et al. ................. 108/20 |

(List continued on next page.)

FOREIGN PATENT DOCUMENTS

| | | |
|---|---|---|
| 63-20014 | 4/1988 | (JP) . |
| 6-163353 | 6/1994 | (JP) . |

OTHER PUBLICATIONS

Moriyama, et al., "Precision X–Y Stage with a Piezo–driven Fine–table," The Bulletin of The Japan Society Precision Engineering, vol. 22, No. 1, pp. 13–17, Mar. 1988.

Primary Examiner—Russell Adams
Assistant Examiner—Hung Henry Nguyen
(74) Attorney, Agent, or Firm—Oliff & Berridge, PLC

(57) ABSTRACT

An exposure apparatus includes an exposure device disposed between a mask and an object. The exposure device exposes a pattern of the mask onto the object. The apparatus also includes a movable mask stage to hold the mask and a movable object stage to hold the object. The apparatus also includes a reaction frame that is dynamically isolated from the exposure device. A reaction force caused by movement of the mask stage and the object stage when the mask stage and the object stage are moved by a drive is transferred substantially to the reaction frame.

27 Claims, 7 Drawing Sheets

U.S. PATENT DOCUMENTS

| | | | |
|---|---|---|---|
| 4,654,571 | 3/1987 | Hinds | 318/687 |
| 4,667,139 | 5/1987 | Hirai et al. | 318/687 |
| 4,675,891 | 6/1987 | Plessis et al. | 378/132 |
| 4,677,651 | 6/1987 | Hartl et al. | 137/132 |
| 4,684,315 | 8/1987 | Sugishima et al. | 414/749 |
| 4,687,980 | 8/1987 | Phillips et al. | 318/640 |
| 4,698,575 | 10/1987 | Bouwer | 318/640 |
| 4,708,465 | 11/1987 | Isohata et al. | 355/53 |
| 4,723,086 | 2/1988 | Leibovich et al. | 310/328 |
| 4,742,286 | 5/1988 | Phillips | 318/640 |
| 4,744,675 | 5/1988 | Sakino et al. | 384/12 |
| 4,750,721 | 6/1988 | Sasada | 269/73 |
| 4,770,531 | 9/1988 | Tanaka et al. | 356/358 |
| 4,803,712 | 2/1989 | Kembo et al. | 378/34 |
| 4,812,725 | 3/1989 | Chitayat | 318/625 |
| 4,817,930 | 4/1989 | Van Deuren | 269/73 |
| 4,818,169 | 4/1989 | Schram et al. | 414/331.18 |
| 4,870,668 | 9/1989 | Frankel et al. | 378/34 |
| 4,887,804 | 12/1989 | Ohtsuka | 269/73 |
| 4,916,340 | 4/1990 | Negishi | 310/12 |
| 4,948,330 | 8/1990 | Nomura et al. | 414/749 |
| 4,952,858 | 8/1990 | Galburt | 318/647 |
| 4,993,696 | 2/1991 | Furukawa et al. | 269/73 |
| 5,022,619 | 6/1991 | Mamada | 248/187.1 |
| 5,040,431 | 8/1991 | Sakino et al. | 74/490.09 |
| 5,059,090 | 10/1991 | Bobroff et al. | 414/749 |
| 5,120,034 | 6/1992 | Van Engelen | 269/73 |
| 5,150,153 | 9/1992 | Franken et al. | 355/53 |
| 5,187,519 | 2/1993 | Takabayashi et al. | 355/30 |
| 5,228,358 | 7/1993 | Sakino et al. | 74/479.01 |
| 5,241,183 | 8/1993 | Kanai et al. | 250/453.11 |
| 5,243,491 | 9/1993 | Van Eijk et al. | 250/492.2 |
| 5,260,580 | 11/1993 | Itoh et al. | 250/442.11 X |
| 5,280,677 | 1/1994 | Kubo et al. | 33/568 |
| 5,285,142 | 2/1994 | Galburt et al. | 318/640 |
| 5,327,060 | 7/1994 | Van Engelen | 318/640 |
| 5,446,519 * | 8/1995 | Machinouchi | 355/53 |
| 5,610,686 * | 3/1997 | Osanai | 355/72 |
| 5,684,856 * | 11/1997 | Itoh et al. | 378/34 |
| 5,796,469 * | 8/1998 | Ebinuma | 355/53 |
| 5,874,820 | 2/1999 | Lee | 318/575 |
| 5,953,105 * | 9/1999 | Van Engelen et al. | 355/53 |
| 6,008,500 * | 12/1999 | Lee | 250/548 |

* cited by examiner

EXPOSURE APPARATUS HAVING DYNAMICALLY ISOLATED REACTION FRAME

This is a division of application Ser. No. 09/192,153 filed Nov. 12, 1998, which in turn is a continuation of application Ser. No. 08/416,558 filed Apr. 4. 1995. now U.S. Pat. No. 5,874,820, The entire disclosure of the prior applications are hereby incorporated by reference herein in their entirety.

BACKGROUND OF THE INVENTION

1. Field of the Invention

This invention relates to precision motion stages and more specifically to a stage suitable for use in a photolithography machine and especially adapted for supporting a reticle.

2. Description of the Prior Art

Photolithography is a well known field especially as applied to semiconductor fabrication. In photolithography equipment a stage (an X-Y motion device) supports the reticle (i.e., mask) and a second stage supports the semiconductor wafer, i.e. the work piece being processed. Sometimes only a single stage is provided, for the wafer or the mask.

Such stages are essential for precision motion in the X-axis and Y-axis directions and often some slight motion is provided for adjustments in the vertical (Z-axis) direction. A reticle stage is typically used where the reticle is being scanned in a scanning exposure system, to provide smooth and precise scanning motion in one linear direction and insuring accurate, reticle to wafer alignment by controlling small displacement motion perpendicular to the scanning direction and a small amount of "yaw" (rotation) in the X-Y plane. It is desirable that such an X-Y stage be relatively simple and be fabricated from commercially available components in order to reduce cost, while maintaining the desired amount of accuracy. Additionally, many prior art stages include a guide structure located directly under the stage itself. This is not a desirable in a reticle stage since it is essential that a light beam be directed through the reticle and through the stage itself to the underlying projection lens. Thus a stage is needed which does not include any guides directly under the stage itself, since the stage itself must define a fairly large central passage for the light beam.

Additionally, many prior art stages do not drive the stage through its center of gravity which undesirably induces a twisting motion in the stage, reducing the frequency response of the stage. Therefore there is a need for an improved stage and especially one suitable for a reticle stage.

SUMMARY

A precision motion stage mechanism includes the stage itself which moves in the X-Y plane on a flat base. The stage is laterally surrounded by a "window frame" guide structure which includes four members attached at or near their corners to form a rectangular structure. The attachments are flexures which are a special type of hinge allowing movement to permit slight distortion of the rectangle. In one version these flexures are thin stainless steel strips attached in an "X" configuration, allowing the desired degree of hinge movement between any two adjacent connected window frame members.

The window frame guide structure moves on a base against two spaced-apart and parallel fixed guides in e.g. the X axis direction, being driven by motor coils mounted on two opposing members of the window frame cooperating with magnetic tracks fixed on the base.

The window frame in effect "follows" the movement of the stage and carries the magnetic tracks needed for movement of the stage in the Y axis direction. (It is to be understood that references herein to the X and Y axes directions are merely illustrative and for purposes of orientation relative to the present drawings and are not to be construed as limiting.)

The stage movement in the direction perpendicular (the Y axis direction) to the direction of movement of the window frame is accomplished by the stage moving along the other two members of the window frame. The stage is driven relative to the window frame by motor coils mounted on the stage and cooperating with magnetic tracks mounted in the two associated members of the window frame.

To minimize friction, the stage is supported on the base by air bearings or other fluid bearings mounted on the underside of the stage. Similarly fluid bearings support the window frame members on their fixed guides. Additionally, fluid bearings load the window frame members against the fixed guides and load the stage against the window frame. So as to allow slight yaw movement, these loading bearings are spring mounted. The stage itself defines a central passage. The reticle rests on a chuck mounted on the stage. Light from an illuminating source typically located above the reticle passes to the central passage through the reticle and chuck to the underlying projection lens.

It is to be understood that the present stage, with suitable modifications, is not restricted to supporting a reticle but also may be used as a wafer stage and is indeed not limited to photolithography applications but is generally suited to precision stages.

An additional aspect in accordance with the present invention is that the reaction force of the stage and window frame drive motors is not transmitted to the support frame of the photolithography apparatus projection lens but is transmitted independently directly to the earth's surface by an independent supporting structure. Thus the reaction forces caused by movement of the stage do not induce undesirable movement in the projection lens or other elements of the photolithography machine.

This physically isolating the stage reaction forces from the projection lens and associated structures prevents these reaction forces from vibrating the projection lens and associated structures. These structures include the interferometer system used to determine the exact location of the stage in the X-Y plane and the wafer stage. Thus the reticle stage mechanism support is spaced apart from and independently supported from the other elements of the photolithography machine and extends to the surface of the earth.

Advantageously, the reaction forces from operation of the four motor coils for moving both the stage and its window frame are transmitted through the center of gravity of the stage, thereby desirably reducing unwanted moments of force (i.e., torque). The controller controlling the power to the four drive motor coils takes into consideration the relative position of the stage and the frame and proportions the driving force accordingly by a differential drive technique.

DETAILED DESCRIPTION OF THE PREFERRED EMBODIMENT

Figure 1:
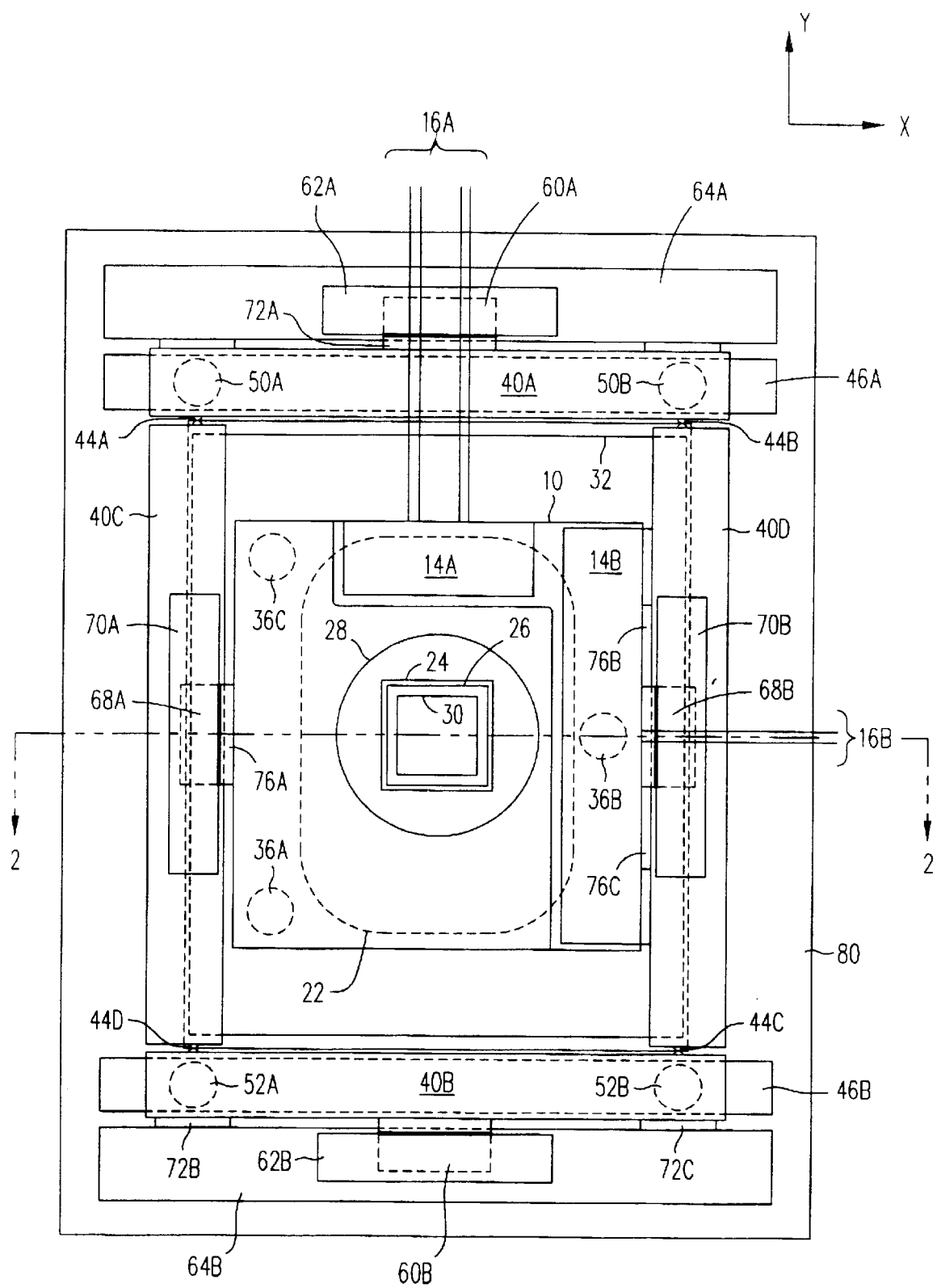
FIG. 1 shows a top view of the present window frame guided stage.

FIG. 1 shows a top view of a stage mechanism in accordance with the present invention. See also copending commonly owned and invented U.S. patent application, Ser. No. 08/221,375 entitled "Guideless Stage with Isolated Reaction stage" filed Apr. 1, 1994, original docket no. NPI0500 which is incorporated herein by reference and shows a related method of supporting elements of a stage mechanism so as to isolate reaction forces from the projection lens and other parts of a photolithography apparatus.

The stage 10 is (in plan view) a rectangular structure of a rigid material (e.g., steel, aluminum, or ceramic). Two interferometry mirrors 14A and 14B located on stage 10 interact conventionally with respectively laser beams 16A and 16B. Conventionally, laser beams 16A are two pairs of laser beams and laser beams 16B are one pair of laser beam, for three independent distance measurements. The underside of stage 10 defines a relieved portion 22 (indicated by a dotted line, not being visible in the plane of the drawing). A reticle 24 is located on stage 10 and held by conventional reticle vacuum groove 26 formed in the upper surface of chuck plate 28. Stage 10 also defines a central aperture 30 (passage) below the location of reticle 24. Central aperture 30 allows the light (or other) beam which penetrates through reticle 24 to enter the underlying projection lens, as described further below. (It is to be understood that the reticle 24 itself is not a part of the stage mechanism.) Moreover if the present stage mechanism is to be used for other than a reticle stage, i.e. for supporting a wafer, aperture 30 is not needed.

Stage 10 is supported on a conventional rectangular base structure 32 of e.g. granite, steel, or aluminum, and having a smooth planar upper surface. The left and right edges (in FIG. 1) of base structure 32 are shown as dotted lines, being overlain by other structures (as described below) in this view. In operation, stage 10 is not in direct physical contact with its base structure 32; instead, stage 10 is vertically supported by, in this example, conventional bearings such as gas bearings. In one embodiment three air bearings 36A, 36B and 36C are used which may be of a type commercially available.

In an alternative air bearing/vacuum structure, the vacuum portion is physically separated from and adjacent to the air bearing portion. It is to be understood that the vacuum and compressed air are provided externally via tubing in a conventional cable bundle and internal tubing distribution system (not shown in the drawings for simplicity). In operation stage 10 thereby floats on the air bearings 36A, 36B, 36C approximately 1 to 3 micrometers above the flat top surface of base structure 32. It is to be understood that other types of bearings (e.g. air bearing/magnetic combination type) may be used alternatively.

Stage 10 is laterally surrounded by the "window frame guide" which is a four member rectangular structure. The four members as shown in FIG. 1 are (in the drawing) the top member 40A, the bottom member 40B, the lefthand member 40C, and the righthand member 40D. The four members 40A–40D are of any material having high specific stiffness (stiffness to density ratio) such as aluminum or a composite material. These four members 40A–40D are attached together by hinge structures which allow non-rigid movement of the four members relative to one another in the X-Y plane and about the Z-axis as shown in the drawing, this movement also referred to as a "yaw" movement. The hinge is described in detail below, each hinge 44A, 44B, 44C and 44D being e.g. one or more metal flexures allowing a slight flexing of the window frame guide structure.

The window frame guide structure moves in the X axis (to the left and right in FIG. 1) supported on horizontal surfaces of fixed guides 46A and 46B, and supported on vertical surfaces of fixed guides 64A, 64B. (It is to be understood that each pair of fixed guides 46A, 64A and 46B, 64B could be e.g. a single L-shaped fixed guide, or other configurations of fixed guides may be used.) Mounted on window frame guide member 40A are two air bearings 50A and 50B that cause the member 40A to ride on its supporting fixed guide member 46A. Similarly air bearings 52A and 52B are mounted on the member 40B, allowing member 40B to ride on its supporting fixed guide member 46B. Air bearings 50A, 50B, 52A, 52B are similar to air bearings 36A, etc.

The window frame guide is driven along the X axis on fixed guides 46A and 46B, 64A and 64B by a conventional linear motor, which includes a coil 60A which is mounted on window frame guide member 40A. Motor coil 60A moves in a magnetic track 62A which is located in (or along) fixed guide 64A. Similarly, motor coil 60B which is mounted on window frame guide member 40B moves in magnetic track 62B which is located in fixed guide 64B. The motor coil and track combinations are part no. LM-310 from Trilogy Company of Webster TX. These motors are also called "linear commutator motors". The tracks 62A, 62B are each a number of permanent magnets fastened together. The electric wires which connect to the motor coils are not shown but are conventional. Other types of linear motors may be substituted. It is to be understood that the locations of the motor coils and magnetic tracks for each motor could be reversed, so that for instance the magnetic tracks are located on stage 10 and the corresponding motor coils on the window frame guide members, at a penalty of reduced performance.

Similarly, stage 10 moves along the Y axis in FIG. 1 by means of motor coils 68A and 68B mounted respectively on the left and right edges of stage 10. Motor coil 68A moves in magnetic track 70A mounted in window frame guide member 40C. Motor coil 68B moves in magnetic track 70B mounted in window frame guide member 40D.

Also shown in FIG. 1 are air bearings 72A, 72B and 72C. Air bearing 72A is located on window frame guide member 40A and minimizes friction between window frame guide member 40A and its fixed guide 64A. Similarly two air bearings 72B and 72C on window frame guide member 40B minimize its friction with the fixed guide 64B. The use of a single air bearing 72A at one end and two opposing air bearings 72B and 72C at the other end allows a certain amount of yaw (rotation in the X-Y plane about the Z-axis) as well as limited motion along the Z-axis. In this case, typically air bearing 72A is gimbal mounted, or gimbal mounted with the gimbal located on a flexure so as to allow a limited amount of misalignment between the member 40A and fixed guide 64A.

The use of the air bearing 72A opposing bearings 72B and 72C provides a loading effect to keep the window frame guide in its proper relationship to fixed guides 64A, 64B. Similarly, an air bearing 76A loads opposing air bearings 76B and 76C, all mounted on side surfaces of the stage 10, in maintaining the proper location of stage 10 relative to the opposing window frame guide members 40B and 40D. Again, in this case one air bearing such as 76A is gimbal mounted to provide a limited amount of misalignment, or gimbal mounted with the gimbal on a flexure (spring). Air bearings 72A, 72B, 72C and 76A, 76B, and 76C are conventional air bearings.

The outer structure 80 in FIG. 1 is the base support structure for the fixed guides 46A, 46B, 64A, 64B and the window frame guide members 40A, . . . , 40D of the stage mechanism, but does not support stage base structure 32. Thus the underlying support is partitioned so the reaction force on base support structure 80 does not couple into the stage base structure 32. Base support structure 80 is supported by its own support pillars or other conventional support elements (not shown in this drawing) to the ground, i.e. the surface of the earth or the floor of a building. An example of a suitable support structure is disclosed in above-referenced U.S. patent application Ser. No. 08/221,375 at FIGS. 1, 1B, 1C. This independent support structure for this portion of stage mechanism provides the above-described advantage of transmitting the reaction forces of the reticle stage mechanism drive motors away from the frame supporting the other elements of the photolithography apparatus, especially away from the optical elements including the projection lens and from the wafer stage, thereby minimizing vibration forces on the projection lens due to reticle stage movement. This is further described below.

The drive forces for the stage mechanism are provided as close as possible through the stage mechanism center of gravity. As can be understood, the center of gravity of the stage mechanism moves with the stage 10. Thus the stage 10 and the window frame guide combine to define a joint center of gravity. A first differential drive control (not shown) for motor coils 60A, 60B takes into account the location of the window frame guide to control the force exerted by each motor coil 60A, 60B to keep the effective force applied at the center of gravity. A second conventional differential drive control (not shown) for motor coils 68A, 68B takes into account the location of stage 10 to control the force exerted by each motor coil 68A, 68B to keep the effective force applied at the center of gravity. It is to be understood that since stage 10 has a substantial range of movement, that the differential drive for the motor coils 60A, 60B has a wide differential swing. In contrast, the window frame guide has no change, hence the differential drive for the motor coils 68A, 68B has a much lesser differential swing, providing a trim effect. Advantageously, use of the window frame guide maintains the reaction forces generated by movement of the reticle stage mechanism in a single plane, thus making easier to isolate these forces from other parts of the photolithography apparatus.

Figure 2:
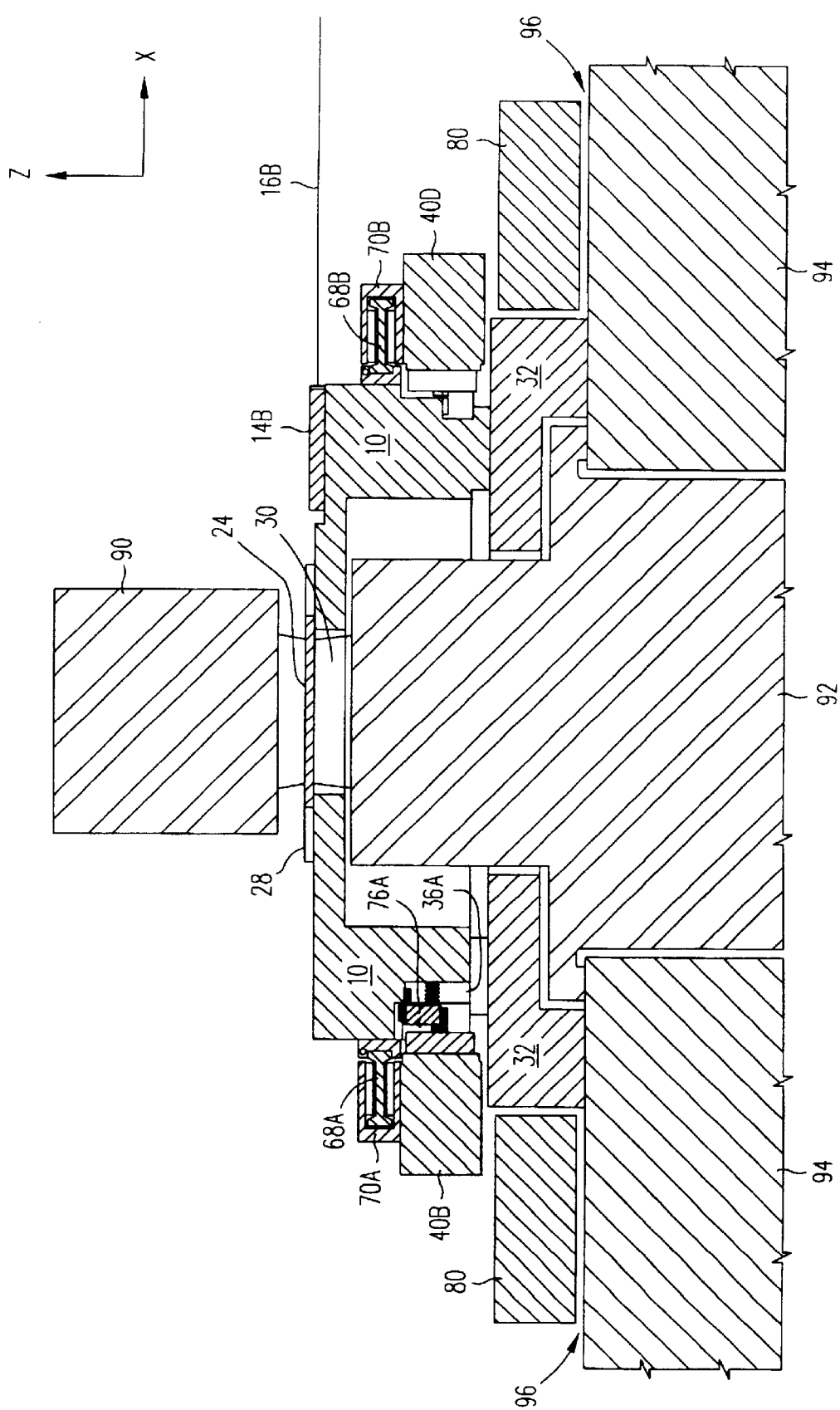
FIG. 2 shows a side view of the window frame guided stage and associated structures.

FIG. 2 shows a cross-sectional view through line 2—2 of FIG. 1. The structures shown in FIG. 2 which are also in FIG. 1 have identical reference numbers and are not described herein. Also shown in FIG. 2 is the illuminator 90 which is a conventional element shown here without detail, and omitted from FIG. 1 for clarity. Also shown without detail in FIG. 2 is the upper portion of the projection lens (barrel) 92. It is to be understood that the lower portion of the projection lens and other elements of the photolithography apparatus are not shown in FIG. 2, but are illustrated and described below.

The supporting structure 94 for the projection lens 92 is also shown in FIG. 2. As can be seen, structure 94 is separated at all points by a slight gap 96 from the base support structure 80 for the reticle stage mechanism. This gap 96 isolates vibrations caused by movement of the reticle stage mechanism from the projection lens 92 and its support 94. As shown in FIG. 2, stage 10 is not in this embodiment a flat structure but defines the underside relieved portion 22 to accommodate the upper portion of lens 92. Magnetic track 70A is mounted on top of the window frame guide 40B and similarly magnetic track 70B is mounted on top of the opposite window frame guide member 40D.

Figure 3A:
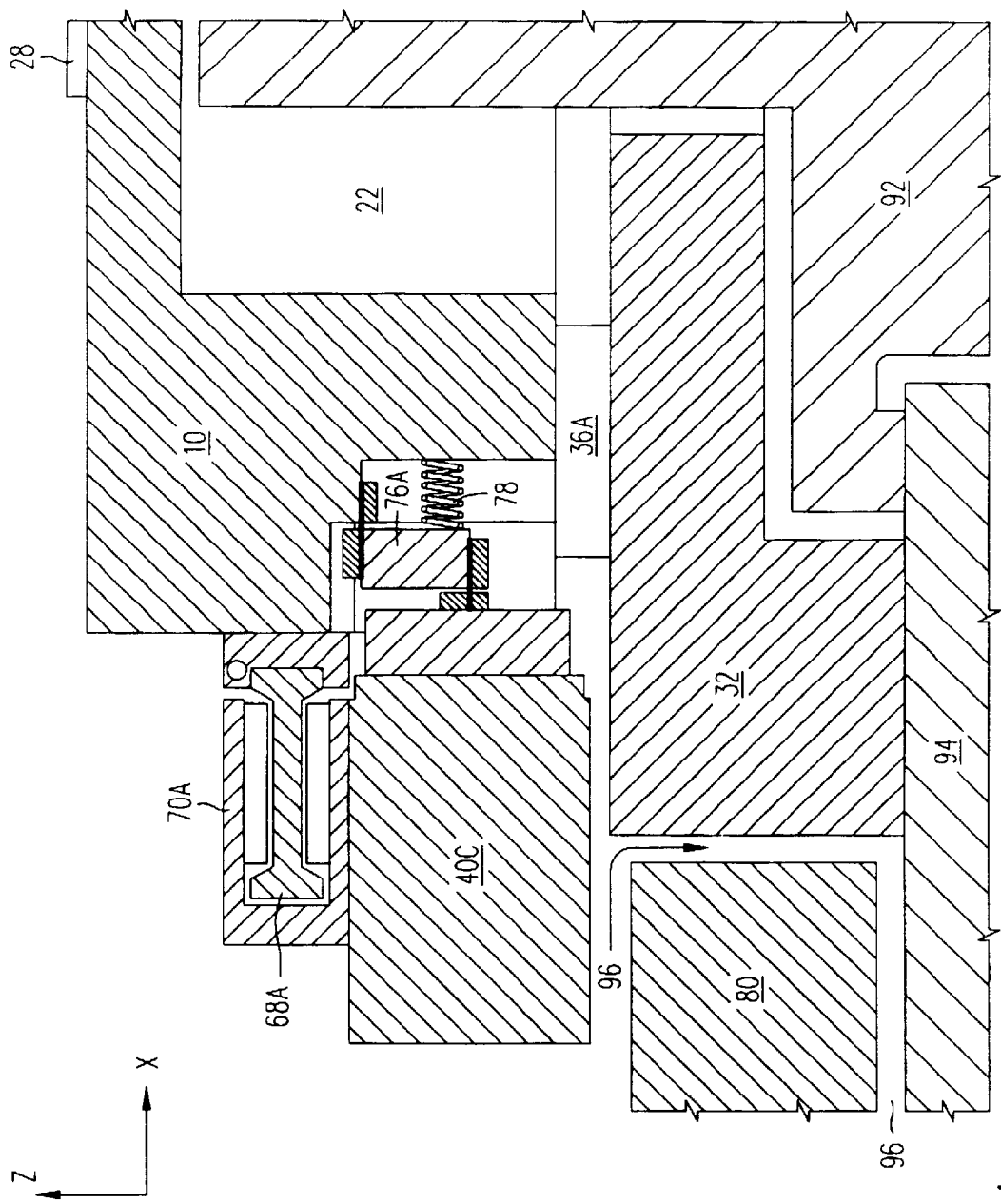
FIGS. 3A and 3B show enlarged views of portions of the structure of FIG. 2.
Figure 3B:
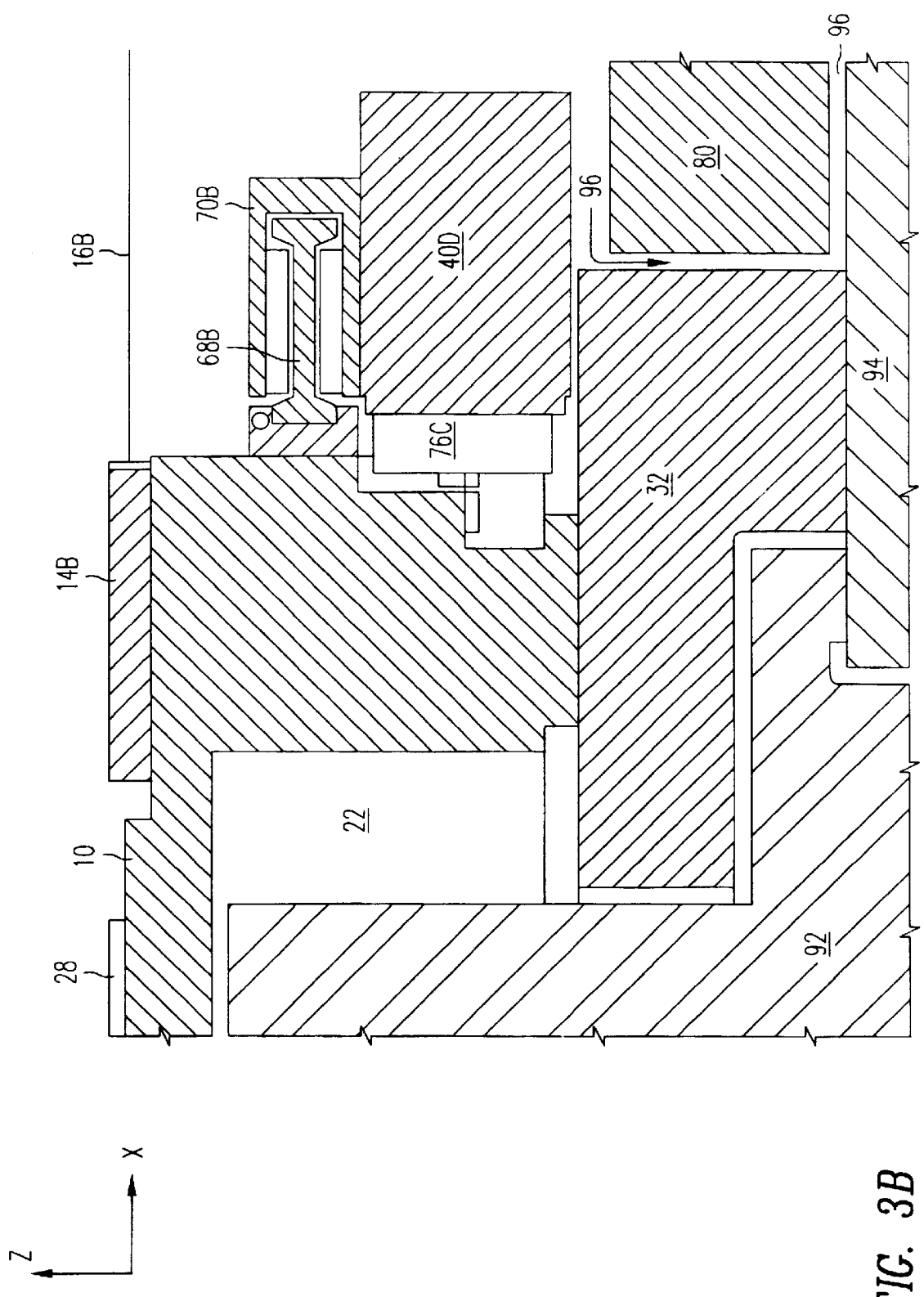

FIGS. 3A and 3B are enlarged views of portions of FIG. 2, with identical reference numbers; FIG. 3A is the left side of FIG. 2 and FIG. 3B is the right side of FIG. 2. Shown in FIG. 3A is the spring mounting 78 for air bearing 76A. Air bearing 78A being spring mounted to a side surface of stage 10, this allows a certain amount of yaw (rotation in the X-Y plane about the Z-axis) as well as limited motion along the Z-axis. A gimbal mounting may be used in place of or in addition to the spring 78. The spring or gimbal mounting thereby allows for a limited amount of misalignment between stage 10 and members 40C, 40D (not shown in FIG. 3A).

Figure 4:
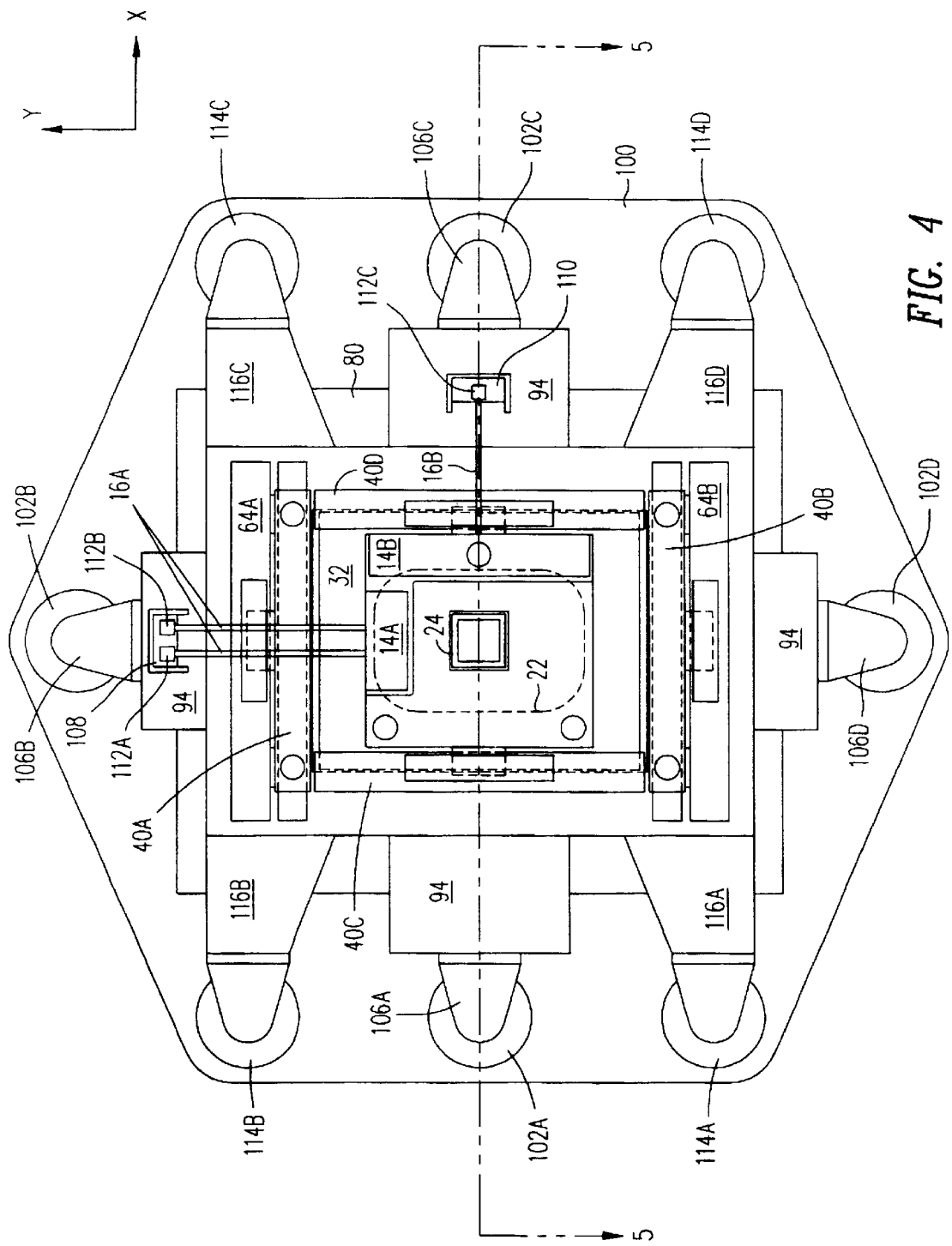
FIG. 4 shows a top view of a photolithography apparatus including the present window frame guided stage.

FIG. 4 is a top view of a photolithography apparatus including the stage mechanism of FIGS. 1 and 2 and further including, in addition to the elements shown in FIG. 1, the supporting base structure 100 which supports the photolithography apparatus including frame 94 except for the reticle stage mechanism. (Not all the structures shown in FIG. 1 are labelled in FIG. 4, for simplicity.) Base structure 100 supports four vertical support pillars 102A, 102B, 102C and 102D connected to structure 94 by respectively bracket structures 106A, 106B, 106C and 106D. It is to be appreciated that the size of the base structure 100 is fairly large, i.e. approximately 3 meters top to bottom in one embodiment. Each pillar 102A, 102B, 102C, 102D includes an internal conventional servo mechanism (not shown) for leveling purposes. Also shown in FIG. 4 are the supports 108 and 110 for respectively laser interferometer units (beam splitter etc.) 112A, 112B, 112C. FIG. 4 will be further understood with reference to FIG. 5 which shows a view of FIG. 4 through cross-sectional line 5—5 of FIG. 4.

Figure 5:
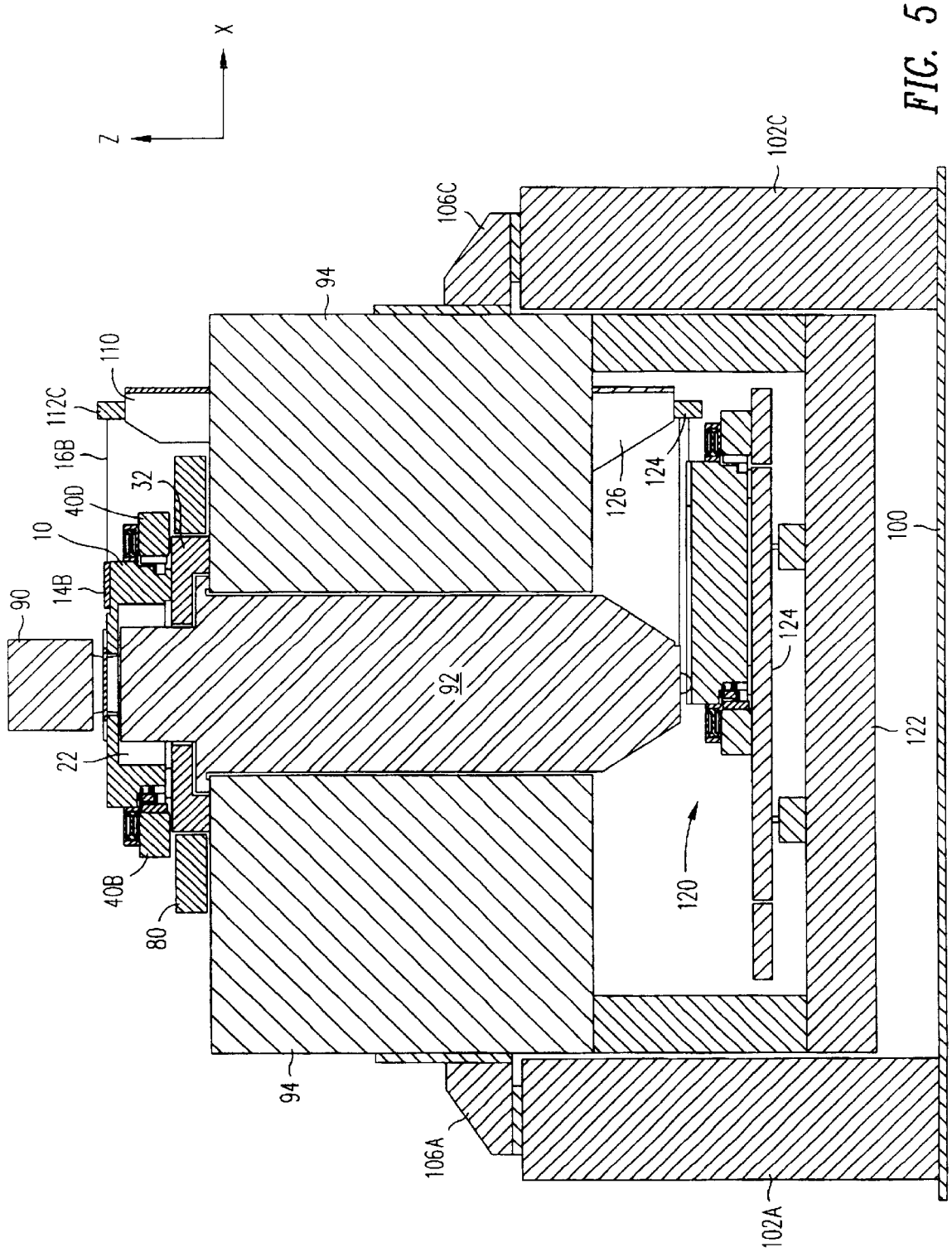
FIG. 5 shows a side view of the photolithography apparatus of FIG. 4.

In FIGS. 4 and 5 the full extent of the supporting structure 94 can be seen along with its support pillars 102A, 102C which rest on the base structure 100 which is in contact with the ground via a conventional foundation (not shown). The independent support structure for the reticle stage base support structure 80 is shown, in FIG. 4 only (for clarity) and similarly includes a set of four pillars 114A, 114B, 114C, 114D with associated bracket structures 116A, 116B, 116C, 116D, with the pillars thereby extending from the level of base support structure 80 down to the base structure 100.

The lower portion of FIG. 5 shows the wafer stage 120 and associated support structures 122, 124. The elements of wafer stage 120 conventionally include (not labelled in the drawing) a base, the stage itself, fixed stage guides located on the base, magnetic tracks located on the fixed stage guides, and motor coils fitting in the magnetic tracks and connected to the stage itself. Laser beams from laser 124 mounted on support 126 locate lens 92 and the stage itself by interferometry.

Figure 6A:
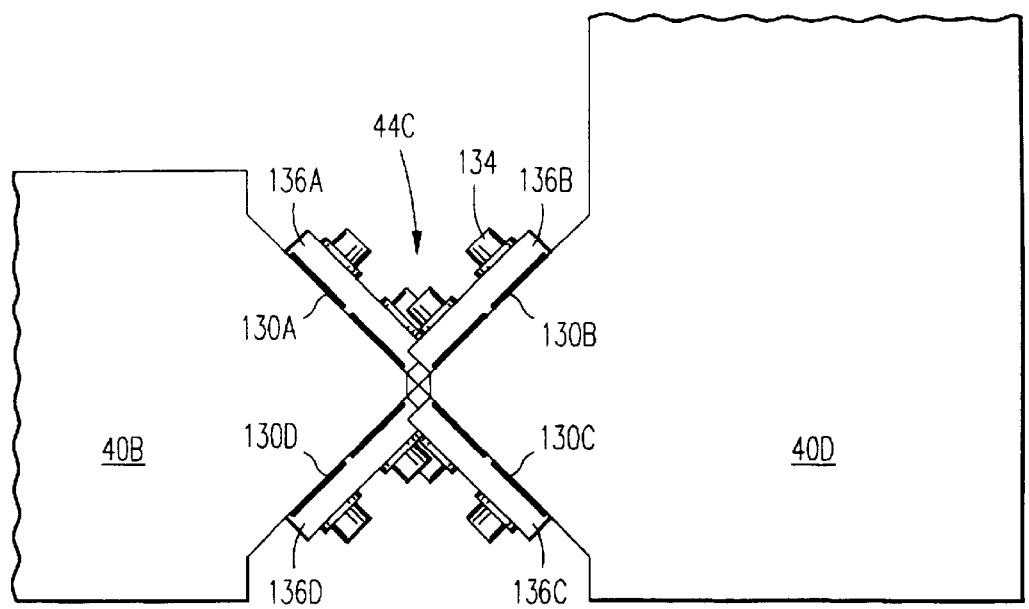
FIGS. 6A and 6B show a flexure hinge structure as used e.g. in the present window frame guided stage.

FIG. 6A shows detail of one of the window frame guide hinged flexure structures, e.g. 44C, in a top view (corresponding to FIG. 1). Each of hinges 44A, 44B, 44C and 44D is identical. These flexure hinges have the advantage over a mechanical-type hinge of not needing lubrication, not exhibiting histeresis (as long as the flexure is not bent beyond its mechanical tolerance) and not having any mechanical "slop", as well as being inexpensive to fabricate.

Each individual flexure is e.g. ¼ hard 302 stainless steel approximately 20 mils (0.02 inch) thick and can sustain a maximum bend of 0.5 degree. The width of each flexure is not critical; a typical width is 0.5 inch. Two, three or four flexures are used at each hinge 44A, 44B, 44C and 44D in FIG. 1. The number of flexures used at each hinge is essentially determined by the amount of space available, i.e., the height of the window frame guide members. The four individual flexures 130A, 130B, 130C, 130D shown in FIG. 6A (and also in a 90° rotated view in FIG. 6B) are each attached by clamps 136A, 136B, 136C, 136D to adjacent frame members (members 40B and 40D in FIGS. 6A and 6B) by conventional screws which pass through holes in the individual flexures 130A, 130B, 130C, 130D and through the clamps and are secured in corresponding threaded holes in frame members 40B and 40D.

Figure 6B:
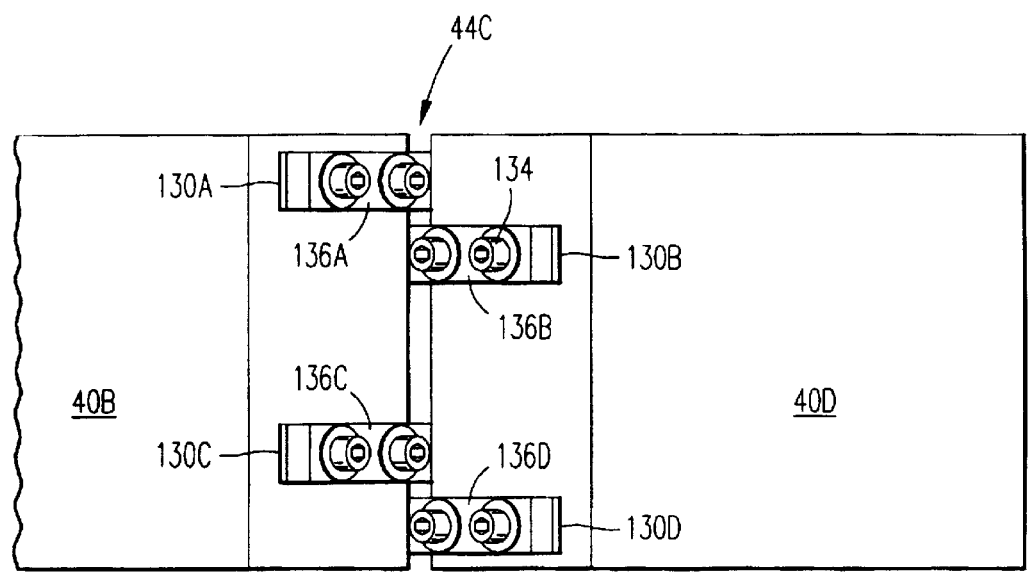

Note that the frame members 40B, 40D of FIGS. 6A and 6B differ somewhat from those of FIG. 1 in terms of the angular (triangular) structures at the ends of frame members 40B, 40D and to which the metal flexures 130A, 130B, 130C, 130D are mounted. In the embodiment of FIG. 1, these angular structures are dispensed with, although their presence makes screw mounting of the flexures easier.

In an alternate embodiment, the window frame guide is not hinged but is a rigid structure. To accommodate this rigidity and prevent binding, one of bearings 72C or 72B is eliminated, and the remaining bearing moved to the center of member 40B, mounted on a gimbal with no spring. The other bearings (except those mounted on stage 10) are also gimballed.

This disclosure is illustrative and not limiting; further modifications will be apparent to one skilled in the art in light of this disclosure and are intended to fall within the scope of the appended claims.

I claim:

1. An exposure apparatus comprising:
   an exposure device disposed between a mask and an object, the exposure device exposes a pattern of the mask onto the object;
   a movable mask stage to hold the mask;
   a movable object stage to hold the object;
   a mask drive to move the mask stage;
   an object drive to move the object stage; and
   a reaction frame dynamically isolated from the exposure device, the mask drive includes a first portion connected to a first portion of the reaction frame and a second portion connected to the mask stage, the object drive includes a first portion connected to a second portion of the reaction frame and a second portion connected to the object stage, wherein a reaction force caused by the movement of the mask stage is transferred to the first portion of the reaction frame and a reaction force caused by the movement of the object stage is transferred to the second portion of the reaction frame.

2. The exposure apparatus of claim 1, wherein the first portion of the reaction frame is separate from the second portion of the reaction frame.

3. The exposure apparatus of claim 1, further comprising a main frame which movably supports the mask stage.

4. The exposure apparatus of claim 3, wherein the exposure device is supported by the main frame.

5. The exposure apparatus of claim 4, wherein the object stage is movably supported by the main frame.

6. The exposure apparatus of claim 3, wherein the mask stage is movable over a surface of the main frame on a bearing.

7. The exposure apparatus of claim 6, wherein the bearing is a non-contact bearing.

8. The exposure apparatus of claim 7, wherein the bearing comprises an air bearing.

9. The exposure apparatus of claim 6, wherein the object stage is movable over a surface of the main frame on a bearing.

10. The exposure apparatus of claim 9, wherein the bearing is a non-contact bearing.

11. The exposure apparatus of claim 10, wherein the bearing is an air bearing.

12. The exposure apparatus of claim 3, wherein the object stage is movably supported by the main frame.

13. The exposure apparatus of claim 1, further comprising a main frame which supports the exposure device.

14. The exposure apparatus of claim 1, further comprising a main frame which movably supports the object stage.

15. The exposure apparatus of claim 1, wherein the reaction frame is supported on a foundation.

16. The exposure apparatus of claim 15, wherein the foundation is a floor.

17. The exposure apparatus of claim 1, wherein the exposure device includes a projection system which projects the pattern.

18. The exposure apparatus of claim 17, wherein the projection system optically projects the pattern.

19. The exposure apparatus of claim 1, wherein the mask drive comprises a linear motor.

20. The exposure apparatus of claim 1, wherein the first portion of the mask drive comprises a magnet and the second portion of the mask drive comprises a coil.

21. The exposure apparatus of claim 1, wherein the mask drive moves the mask stage in a two-dimensional plane.

22. The exposure apparatus of claim 1, wherein the mask stage is made of ceramic or steel.

23. The exposure apparatus of claim 1, wherein the object drive comprises a linear motor.

24. The exposure apparatus of claim 1, wherein the first portion of the object drive comprises a magnet and the second portion of the object drive comprises a coil.

25. The exposure apparatus of claim 1, wherein the object drive moves the object stage in a two-dimensional plane.

26. The exposure apparatus of claim 1, wherein the mask stage comprises an opening through which the exposure device exposes the pattern onto the object.

27. The exposure apparatus of claim 1, wherein the exposure apparatus is a scanning type exposure apparatus.

* * * * *